(12) United States Patent
Lin et al.

(10) Patent No.: US 12,278,655 B2
(45) Date of Patent: Apr. 15, 2025

(54) SELF-LOOPBACK RADIO TRANSMITTER

(71) Applicant: Realtek Semiconductor Corp., Hsinchu (TW)

(72) Inventors: Chia-Liang (Leon) Lin, Fremont, CA (US); Ting-Hsu Chien, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 443 days.

(21) Appl. No.: 18/046,216

(22) Filed: Oct. 13, 2022

(65) Prior Publication Data

US 2024/0097720 A1 Mar. 21, 2024

Related U.S. Application Data

(60) Provisional application No. 63/375,700, filed on Sep. 15, 2022.

(51) Int. Cl.
*H04B 1/04* (2006.01)
*H03F 3/24* (2006.01)

(52) U.S. Cl.
CPC ............... *H04B 1/04* (2013.01); *H03F 3/245* (2013.01); *H03F 2200/451* (2013.01)

(58) Field of Classification Search
CPC ...... H04B 17/14; H04B 17/19; H04B 17/104; H04B 1/40; H04B 1/30; H04B 1/0475; H04B 2001/0433; H04B 17/20; H04B 1/707; H04B 1/713; H04B 17/101; H04B 1/18; H04B 1/006; H04B 1/1018; H04B 1/1638; H04B 1/0458; H04B 2001/045; H04B 7/0413; H04B 7/0452; H04B 7/084; H03F 2200/451; H03F 2200/294; H03F 3/245; H03F 3/45475; H03F 3/45179; H03F 3/19; H03F 2203/45638; H03F 2203/45526; H03F 2203/45386; H03F 2200/372; H03F 1/56; H03F 2200/318; H03H 11/1291; H03H 2011/0494; H03H 21/0001; H03H 21/0012; H03H 11/126; H03H 2210/025; H03H 2210/036; H03H 11/22;
(Continued)

(56) References Cited

U.S. PATENT DOCUMENTS 10,931,384 B1* 2/2021 Borokhovich ........... H04B 1/04
11,190,147 B1* 11/2021 Koroglu ............... H04B 1/0475
(Continued)

*Primary Examiner* — Golam Sorowar
(74) *Attorney, Agent, or Firm* — McClure, Qualey & Rodack, LLP

(57) ABSTRACT

A self-loopback radio transmitter having a transmitter with a modulator configured to up-convert a first baseband signal into a first RF (radio frequency) signal in accordance with a first LO (local oscillator) signal, and a power amplifier configured to receive the first RF signal and output a second RF signal to be emitted by an antenna and a third RF signal to be looped back, wherein the third RF signal is magnetically coupled from the second RF signal; and a loopback network having a shielded serial inductor configured to receive the third RF signal and output a fourth RF signal, and a demodulator configured to down-convert the fourth RF signal into a second baseband signal in accordance with a second LO signal, wherein the shielded serial inductor has a serial inductor of spiral topology and a coil laid out on a lower metal layer.

13 Claims, 6 Drawing Sheets

(58) Field of Classification Search
CPC .................. H03H 11/344; H03H 7/42; H03H 2001/0078; H03H 7/0115; H03H 2007/013; H03H 2210/012; H03H 7/06
See application file for complete search history.

(56) References Cited

U.S. PATENT DOCUMENTS

| | | | |
|---|---|---|---|
| 11,316,482 B2* | 4/2022 | Panseri | H03F 1/3241 |
| 2020/0136660 A1* | 4/2020 | Behzad | H04B 1/0475 |
| 2021/0217557 A1 | 7/2021 | Sayilir et al. | |
| 2023/0421204 A1* | 12/2023 | Frederick | H04B 5/77 |
| 2025/0055498 A1* | 2/2025 | Yue | H04B 1/403 |

* cited by examiner

SELF-LOOPBACK RADIO TRANSMITTER

CROSS REFERENCE TO RELATED APPLICATION

The present application claims priority to Provisional Application Ser. No. 63/375,700, filed Sep. 15, 2022, which is herein incorporated by reference.

BACKGROUND OF THE DISCLOSURE

Field of the Disclosure

This present disclosure generally relates to self-loopback radio transmitters, and more particularly to self-loopback radio transmitters with a high-linearity, low-noise loopback network.

Description of Related Art

As shown in FIG. 1, a radio transmitter 100 comprises: a modulator 110 configured to receive a baseband signal $X_1$ and output a RF (radio frequency) signal $X_2$, and a power amplifier 120 configured to receive the RF signal $X_2$ and output an antenna signal $X_3$ to be emitted by an antenna 130. Ideally, the antenna signal $X_3$ is a frequency translation of the baseband signal $X_1$, and is proportional to (or linearly dependent on) the baseband signal $X_1$. In practice, however, modulator 110 and power amplifier 120 might have a nonlinearity, causing $X_3$ to be impaired and no longer perfectly proportional to (or linearly dependent on) the baseband signal $X_1$. It is very helpful, if a monitor circuit can be used to monitor the antenna signal $X_3$ so that the nonlinearity of modulator 110 and power amplifier 120 can be characterized and possibly corrected by pre-distorting the baseband signal $X_1$. The monitor circuit itself, however, must not introduce appreciable impairments including nonlinearity and noise, otherwise the true nonlinearity of modulator 110 and power amplifier 120 might be obscured.

What is desired is a radio transmitter with a monitor circuit made up of a high-linearity, low-noise loopback network.

SUMMARY OF THE DISCLOSURE

In an embodiment, a self-loopback radio transmitter comprises: a transmitter comprising a modulator configured to up-convert a first baseband signal into a first RF (radio frequency) signal in accordance with a first LO (local oscillator) signal of a LO frequency, and a power amplifier configured to receive the first RF signal and output a second RF signal to be emitted by an antenna and a third RF signal to be looped back, wherein the third RF signal is magnetically coupled from the second RF signal; and a loopback network comprising a shielded serial inductor configured to receive the third RF signal and output a fourth RF signal, and a demodulator configured to down-convert the fourth RF signal into a second baseband signal in accordance with a second LO signal of the LO frequency, wherein the shielded serial inductor is laid out in a multi-layer structure including an upper metal layer and a lower metal layer, and comprises a serial inductor of spiral topology comprising a coil laid out on the lower metal layer shielded by a shield that is laid out on the upper metal layer and connected to a ground node.

DETAILED DESCRIPTION OF THIS DISCLOSURE

Figure 1:
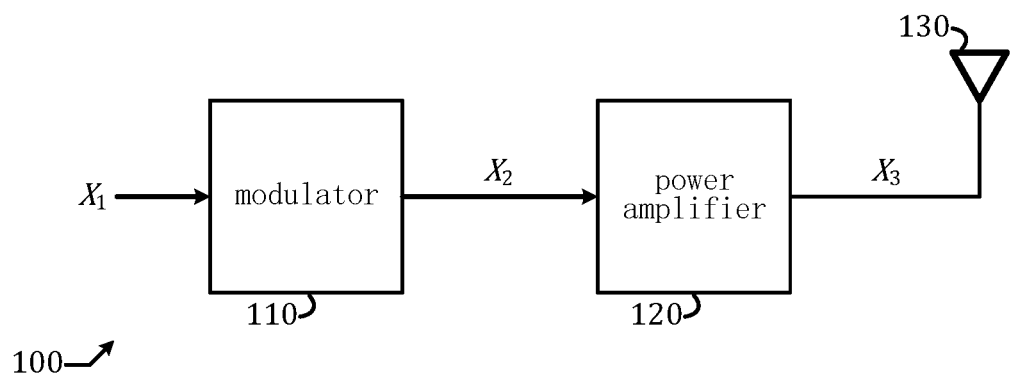
FIG. 1 shows a schematic diagram of a radio transmitter.

The present disclosure is directed to embodiments of self-loopback radio transmitters. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "noise," "nonlinearity," "amplifier," "differential signal," "mixer," "load," "capacitor," "resistor," "inductor" "impedance," "magnetic coupling," "LC (which stands for inductor-capacitor) tank," "circuit node," "ground," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skill in the art can read schematics of a circuit comprising electronic components such as inductors, capacitors, resistors, NMOS transistors, PMOS transistors, switches, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of a transistor, a capacitor, a resistor, and/or other electronic devices inter-connected in a certain manner to embody a certain function.

A network is a circuit or a collection of circuits.

In this disclosure, a "circuit node" is frequently simply stated as a "node" for short, when what it means is clear from a context.

A signal is either a voltage or a current of a variable level that carries a certain information and can vary with time. A level of the signal at a moment represents a state of the signal at that moment.

A voltage signal in a differential-signaling embodiment comprises two voltages, one denoted by a suffix "+" attached in subscript and the other denoted by a suffix "−" attached in subscript, and a value of said voltage signal is represented by a difference between the two voltages. For instance, a voltage signal $v_1$ comprises two voltages $v_{1+}$ and $v_{1-}$, and a voltage of $v_1$ is represented by $v_{1+}-v_{1-}$.

A signal is said to be output from a first device to a second device when a change of said signal is originated and dictated by the first device while the second device is said to be receiving said signal and reacts to the change of said signal accordingly.

A logical signal is a voltage signal of two states: a low state and a high state, with respect to an associated trip point. Regarding a logical signal Q, "Q is high" or "Q is low," means that "Q is in the high state" (i.e., above the associated trip point) or "Q is in the low state" (i.e., below the associated trip point).

A logical signal is often used as a control signal to enable or disable a function of a circuit. When the logical signal is in a logical state that enables the function of the circuit, the logical signal is said to be "asserted"; otherwise, the logical signal is said to be "de-asserted." If a logical signal is "asserted" when it is high, it is said to be "active high"; if a logical signal is "asserted" when it is low, it is said to be "active low." An "active high" logical signal is asserted when it is above a trip point, and de-asserted when it is below the trip point.

A first logical signal is said to be a logical inversion of a second logical signal if the first logical signal and the second logical signal always have opposite states. That is, when the first logical signal is high, the second logical signal will be low; when the first logical signal is low, the second logical signal will be high. When a first logical signal is a logical inversion of a second logical signal, the first logical signal is said to be complementary to the second logical signal.

A switch is a device configured to provide connection between a first node and a second node in accordance with a logical signal; said switch is turned on and behaves like a short circuit when the logical signal is asserted; and said switch is turned off and behaves like an open circuit when the logical signal is de-asserted.

A clock is a logical signal that periodically toggles back and forth between a low state and a high state.

Resistors, capacitors, and inductors are "passive" and are usually highly linear.

Inductors are "reactive," can effectively store magnetic energy, and usually do not contribute much noise.

Figure 2:
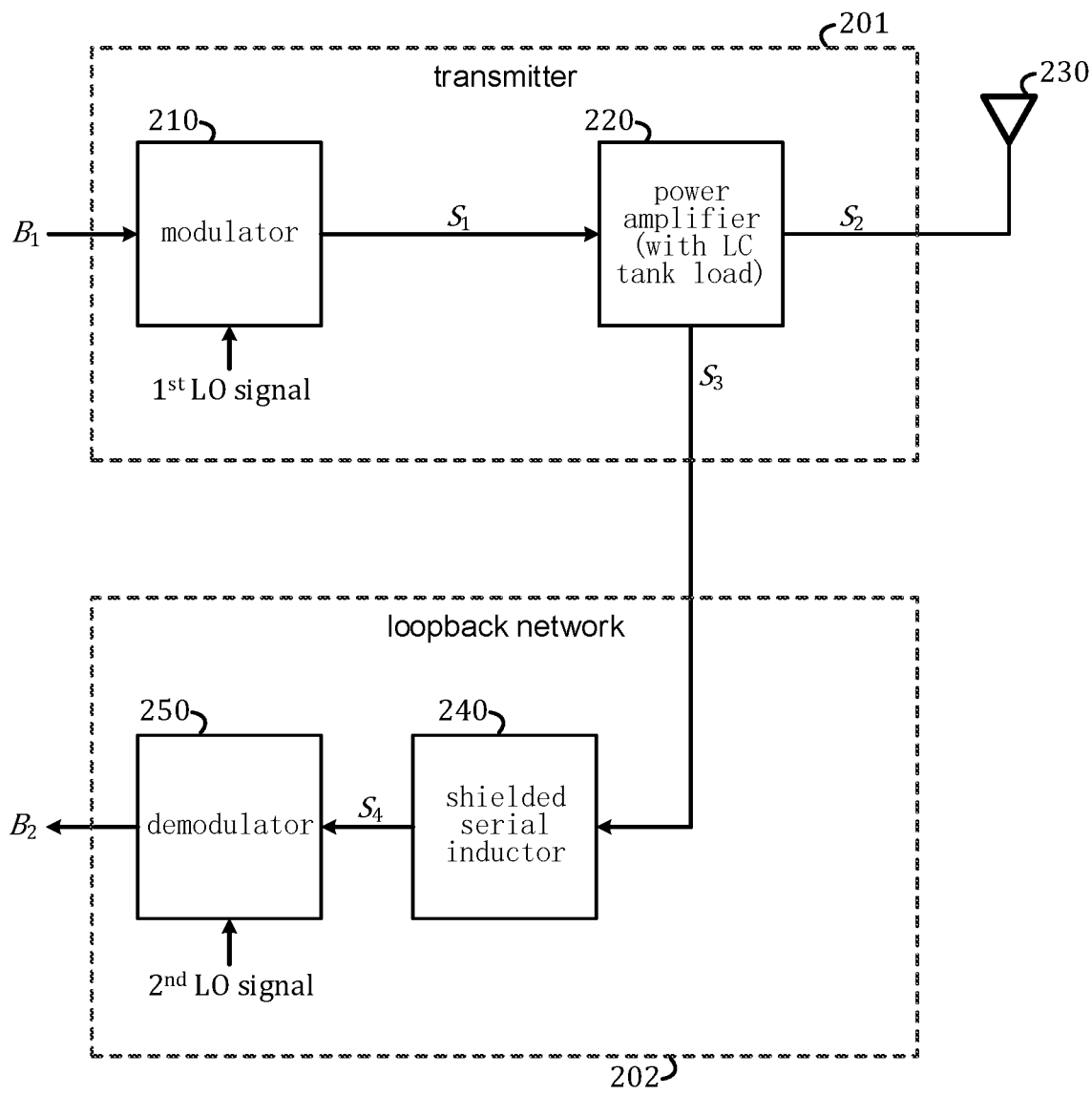
FIG. 2 shows a schematic diagram of a self-loopback radio transmitter in accordance with an embodiment of the present disclosure.

As shown in FIG. 2, a self-loopback radio transmitter 200 comprises a transmitter 201 and a loopback network 202; the transmitter 201 comprises: a modulator 210 configured to receive a first baseband signal $B_1$ and output a first RF (radio frequency) signal $S_1$ in accordance with a first LO (local oscillator) signal of a LO frequency $f_{LO}$, and a power amplifier (with LC tank load) 220 configured to receive the first RF signal $S_1$ and output a second RF signal $S_2$ (to be emitted by an antenna 230) and a third RF signal $S_3$ (to be looped back to the loopback network 202); and the loopback network 202 comprises: a shielded serial inductor 240 configured to receive the third RF signal $S_3$ and output a fourth RF signal $S_4$, and a demodulator 250 configured to receive the fourth RF signal $S_4$ and output a second baseband signal $B_2$ in accordance with a second LO signal of the LO frequency $f_{LO}$. A purpose of the transmitter 201 is to up-convert $B_1$ into $S_2$ that is suitable for transmission over the air by the antenna 230. A purpose of the loopback network 202 is to down-convert $S_3$, which is a replica of $S_2$, into $B_2$. If both the transmitter 201 and the loopback network 202 are perfectly linear, $B_2$ will be strictly linearly dependent on $B_1$. When $B_2$ is not strictly linearly dependent on $B_1$, it indicates an existence of a nonlinearity in the transmitter 201, or the loopback network 202, or both. If a nonlinearity of the loopback network 202 is much smaller than a nonlinearity of the transmitter 201, the nonlinearity of the transmitter 201 can be characterized by observing how $B_2$ deviates from the strict linear dependence on $B_1$, and may be corrected by a pre-distortion of $B_1$.

$B_1$ is a two-dimensional signal, which can be represented by a complex signal comprising a real part, which is often referred to as an in-phase component $B_{1I}$ and an imaginary part, which is often referred to as a quadrature component $B_{1Q}$, and mathematically can be expressed by the following equation:

$$B_1(t)=B_{1I}(t)+jB_{1Q}(t) \tag{1}$$

Here, "j" is a unity imaginary number that is equal to square root of −1, and t denotes a time variable.

The first LO signal is a clock generated by a local oscillator and is a two-dimensional signal comprising an in-phase component $V_I(t)$ and a quadrature component $V_Q(t)$. In an embodiment, the in-phase component $V_I(t)$ is a sinusoidal wave of the LO frequency $f_{LO}$, while the quadrature component $V_Q(t)$ is the same as the in-phase component $V_I(t)$ except for a 90-degree phase shift. When neglecting a nonlinearity of modulator 210, $S_1$ is a frequency-translated replica of $B_1$ and can be mathematically expressed by the following equation:

$$S_1(t)=G_1 B_1(t)e^{j(2\pi f_{LO}+\theta_1)} \tag{2}$$

Here, $G_1$ and $\theta_1$ are a gain and a phase shift of modulator 210, respectively.

Power amplifier 220 amplifies $S_1$ into $S_2$. When neglecting a non-ideal aspect of power amplifier 220, $S_2$ can be mathematically expressed by the following equation:

$$S_2(t)=G_2 e^{j\theta_2}S_1(t)=G_1 G_2 B_1(t)e^{j(2\pi f_{LO}+\theta_1+\theta_2)} \tag{3}$$

Here, $G_2$ and $\theta_2$ are a gain and a phase shift of power amplifier 220, respectively.

Power amplifier 220 comprises a load made up of a LC (which stands for inductor-capacitor) tank of a resonant frequency that is approximately equal to $f_{LO}$ so that power amplifier 220 can provide a high gain for $S_2$, i.e., $G_2$ can be large.

$S_3$ is magnetically coupled from $S_2$ via an inductor of the LC tank within power amplifier 220 to become a replica of $S_2$ with a coupling loss and an additional phase shift, and can be mathematically expressed by the following equation:

$$S_3(t)=G_3 e^{j\theta_3}S_2(t)=G_1 G_2 G_3 B_1(t)e^{j(2\pi f_{LO}+\theta_1+\theta_2+\theta_3)} \tag{4}$$

Here, $G_3$ and $\theta_3$ are the coupling loss and the additional phase shift of the magnetic coupling, respectively.

The shielded serial inductor 240 receives $S_3$ and output $S_4$ so that $S_4$ can be mathematically expressed by the following equation:

$$S_4(t)=G_4 e^{j\theta_4}S_3(t)=G_1 G_2 G_3 G_4 B_1(t)e^{j(2\pi f_{LO}+\theta_1+\theta_2+\theta_3+\theta_4)} \tag{5}$$

Here, $G_4$ and $\theta_4$ are an insertion loss and a phase shift caused by the shielded serial inductor 240.

The demodulator 250 performs a reverse frequency translation to convert $S_4$ into $B_2$, which is a two-dimensional signal comprising an in-phase component $B_{2I}$ and a quadrature component $B_{2Q}$ and mathematically can be expressed by the following equation in a complex-signal notation:

$$B_2(t)=B_{2I}(t)+jB_{2Q}(t) \tag{6}$$

When neglecting a nonlinearity of demodulator 250, $B_2$ can be expressed by the following equation:

$$B_2(t)=G_5 e^{j(-2\pi f_{LO}+\theta_5)} S_4(t)=G_1 G_2 G_3 G_4 G_5 B_1(t) e^{j(\theta_1+\theta_2+\theta_3+\theta_4+\theta_5)} \quad (7)$$

Here, $G_5$ and $\theta_5$ are a gain and a phase shift caused by the demodulator 250. A total gain $G_T$ from the first baseband signal $B_1(t)$ to the second baseband signal $B_2(t)$ can be expressed by the following equation:

$$G_T \equiv \frac{B_2(t)}{B_1(t)} = G_1 G_2 G_3 G_4 G_5 e^{j(\theta_1+\theta_2+\theta_3+\theta_4+\theta_5)} \quad (8)$$

In the presence of nonlinearity, however, the total gain $G_T$ may be distorted and deviate from what is expressed by equation (8). A purpose of the loopback network 202 is to detect a nonlinearity of the transmitter 201. If a nonlinearity of the loopback network 202 is much smaller than the nonlinearity of the transmitter 201, then by observing how the total gain $G_T$ deviates from what is expressed by equation (8), the nonlinearity of the transmitter 201 can be characterized. The loopback network 202, however, might introduce additive noise that can obscure the characterization of the total gain $G_T$.

In short, to effectively characterize the nonlinearity of the transmitter 201 via using the loopback network 202, the loopback network 202 must be highly linear and have low noise.

Figure 3:
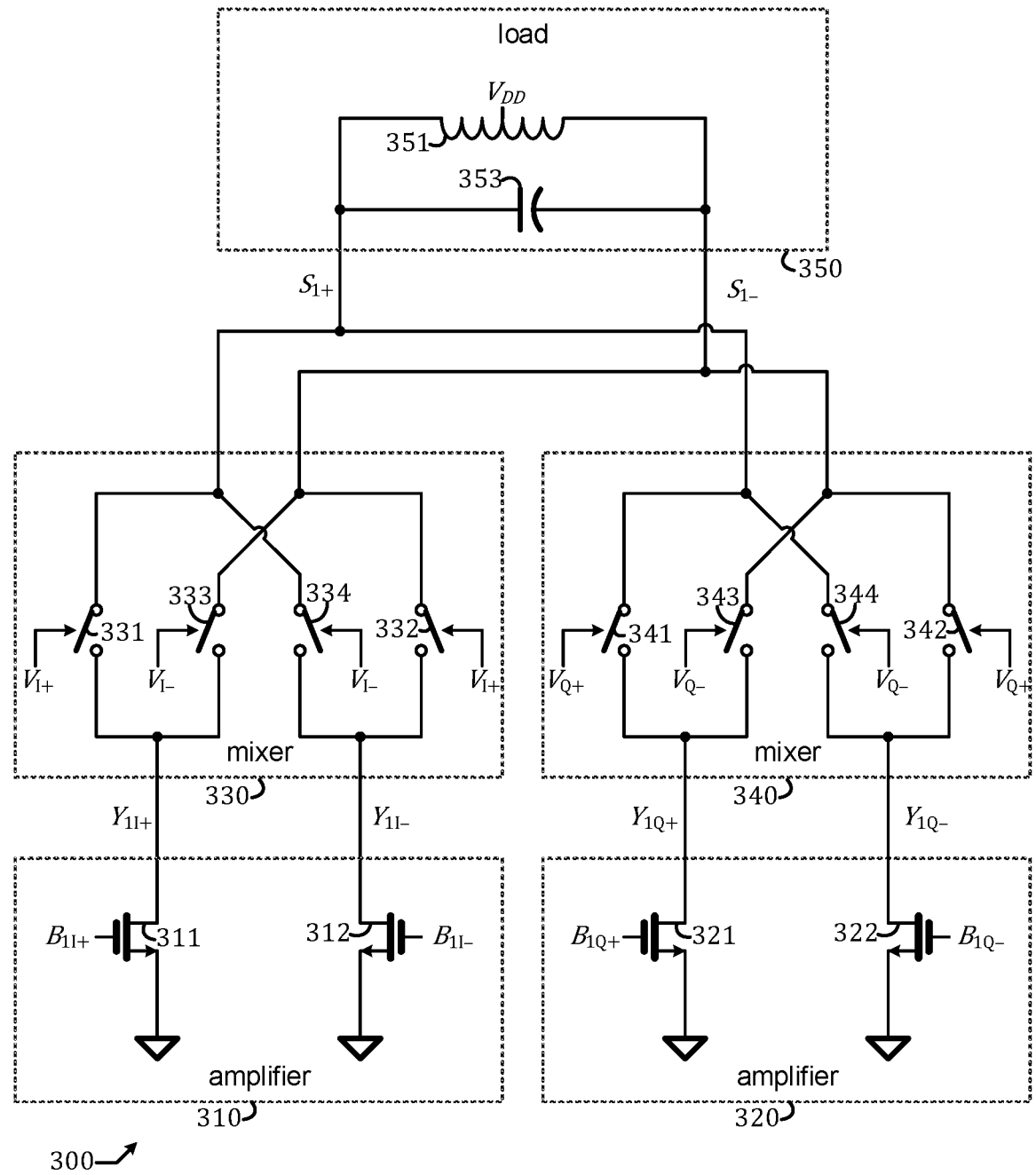
FIG. 3 shows a schematic diagram of a modulator that can be used in the self-loopback radio transmitter of FIG. 2.

A schematic diagram of a modulator 300 that can be used to embody the modulator 210 of FIG. 2 is shown in FIG. 3. Modulator 300 comprises a first amplifier 310, a second amplifier 320, a first mixer 330, a second mixer 340, and a load 350, and is configured to receive the in-phase component $B_{1I}$ and the quadrature component $B_{1Q}$ of $B_1$ and output $S_1$ in accordance with the first LO signal (which, as stated earlier, is a two-dimensional signal comprising in-phase component $V_I$ and quadrature component $V_Q$). Here, a differential-signaling embodiment is used, wherein $B_{1I}$ comprises two voltages $B_{1I+}$ and $B_{1I-}$, $B_{1Q}$ comprises two voltages $B_{1Q+}$ and $B_{1Q-}$, $V_I$ comprises two voltages $V_{I+}$ and $V_{I-}$, $V_Q$ comprises two voltages $V_{Q+}$ and $V_{Q-}$, and $S_1$ comprises two voltages $S_{1+}$ and $S_{1-}$. The first amplifier 310 comprises two NMOS transistors 311 and 312 configured to receive $B_{1I+}$ and $B_{1I-}$ and output two voltages $Y_{1I+}$ and $Y_{1I-}$, respectively. The second amplifier 320 comprises two NMOS transistors 321 and 322 configured to receive $B_{1Q+}$ and $B_{1Q-}$ and output two voltages $Y_{1Q+}$ and $Y_{1Q-}$, respectively. The first mixer 330 comprises four switches 331, 332, 333, and 334, while the second mixer 340 comprises four switches 341, 342, 343, and 344. Switch 331 (332, 333, 334, 341, 342, 343, 344) is configured to connect $Y_{1I+}$ ($Y_{1I-}$, $Y_{1I+}$, $Y_{1I-}$, $Y_{1Q+}$, $Y_{1Q-}$, $Y_{1Q+}$, $Y_{1Q-}$) to $S_{1+}$ ($S_{1-}$, $S_{1-}$, $S_{1+}$, $S_{1+}$, $S_{1-}$, $S_{1-}$, $S_{1+}$) in accordance with $V_{I+}$ ($V_{I+}$, $V_{I-}$, $V_{I-}$, $V_{Q+}$, $V_{Q+}$, $V_{Q-}$, $V_{Q-}$). The load 350 comprises a parallel connection of an inductor 351 (with a center-tap connected to a power supply node $V_{DD}$) and a capacitor 353 configured to form a resonant network to provide a high impedance at $f_{LO}$, i.e., the frequency of $V_I$ and $V_Q$. Mathematically, $V_{I+}$, $V_{I-}$, $V_{Q+}$ and $V_{Q-}$ can be modeled by the following equations in time domain:

$$V_{I+}=V_{trip}+V_C \cdot \cos(2\pi f_{LO} t) \quad (9)$$

$$V_{I-}=V_{trip}-V_C \cdot \cos(2\pi f_{LO} t) \quad (10)$$

$$V_{Q+}=V_{trip}-V_C \cdot \sin(2\pi f_{LO} t) \quad (11)$$

$$V_{Q-}=V_{trip}+V_C \cdot \sin(2\pi f_{LO} t) \quad (12)$$

Here, $V_{trip}$ is a trip point for the logical control signal for switches 331, 332, 333, 334, 341, 342, 343, and 344, and $V_C$ denotes an amplitude of the first local oscillator signal. $V_{I+}$ and $V_{I-}$ are complementary, while $V_{Q+}$ and $V_{Q-}$ are complementary. When $V_{I+}$ is higher (lower) than $V_{trip}$, $V_{I-}$ will be lower (higher) than $V_{trip}$; incidentally, $V_{I+}$ is asserted (de-asserted) and $V_{I-}$ is de-asserted (asserted), switches 331 and 332 are turned on (off) while switches 333 and 334 are turned off (on). Likewise, when $V_{Q+}$ is higher (lower) than $V_{trip}$, $V_{Q-}$ will be lower (higher) than $V_{trip}$; incidentally, $V_{Q+}$ is asserted (de-asserted) and $V_{Q-}$ is de-asserted (asserted), switches 341 and 342 are turned on (off) while switches 343 and 344 are turned off (on).

It is known in the prior art that modulator 300 that can fulfill the function expressed by equation (2) and no further explanation is needed.

Figure 4:
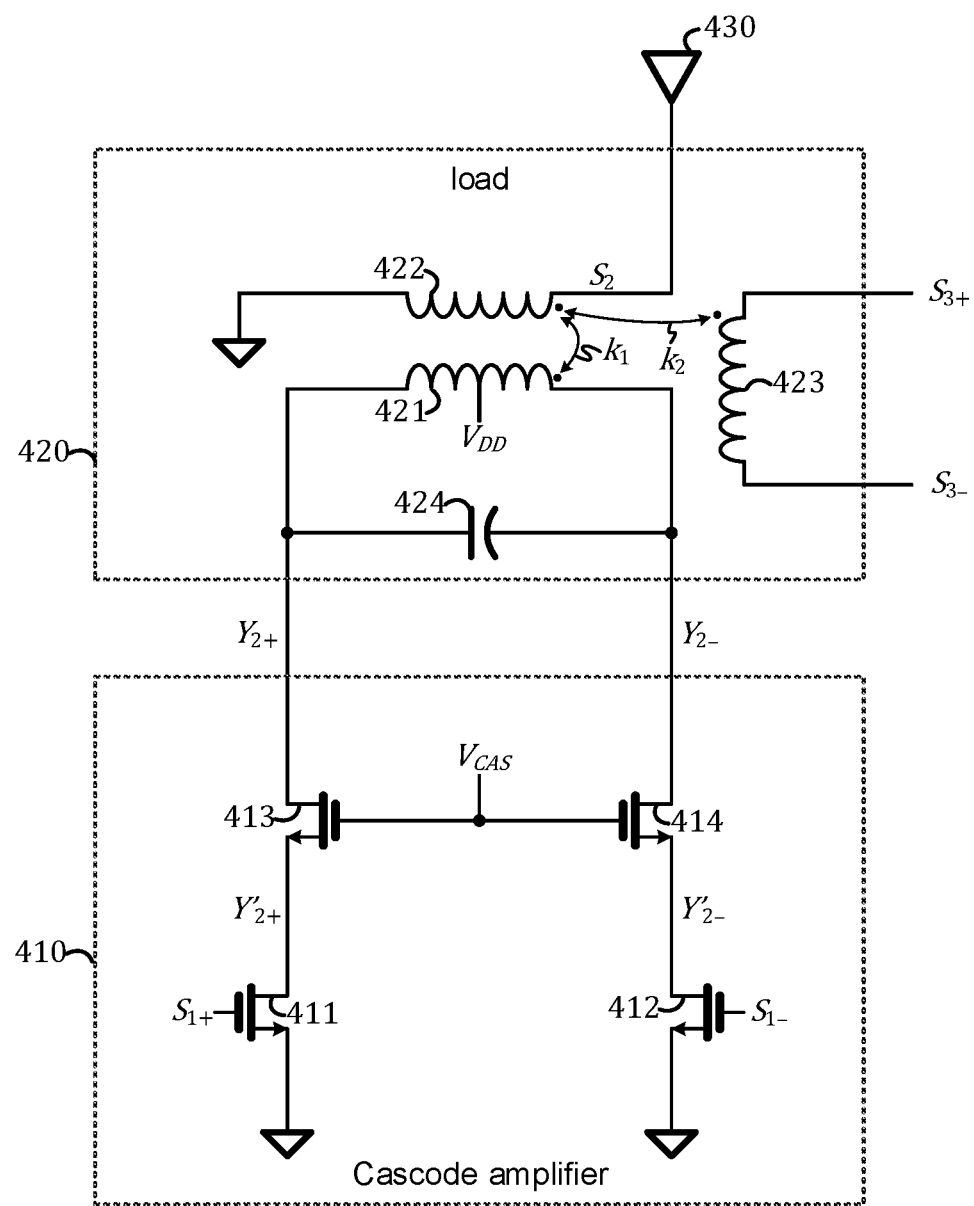
FIG. 4 shows a schematic diagram of a power amplifier that can be used in the self-loopback radio transmitter of FIG. 2.

A schematic diagram of a power amplifier 400 that can be used to embody the power amplifier 220 of FIG. 2 is shown in FIG. 4. The power amplifier 400 comprises a cascode amplifier 410 and a load 420 and is configured to receive the first RF signal $S_1$ and output the second RF signal $S_2$ and the third RF signal $S_3$, wherein in a differential-signaling embodiment $S_1$ comprises two voltages $S_{1+}$ and $S_{1-}$, while $S_3$ comprises two voltages $S_{3+}$ and $S_{3-}$. Cascode amplifier 410 comprises four NMOS transistors 411, 412, 413, and 414, wherein NMOS transistors 411 and 412 embody a common-source amplifier, while NMOS transistors 413 and 414 embody a cascode stage biased by a bias voltage $V_{CAS}$. Concepts of "cascode amplifier," "common-source amplifier," and "cascode stage," and "bias" are well understood by those of ordinary skill in the art and thus not explained in detail. NMOS transistors 411 and 412 receive $S_{1+}$ and $S_{1-}$ and outputs two intermediate voltages $Y'_{2+}$ and $Y'_{2-}$, respectively, while NMOS transistors 413 and 414 receive $Y'_{2+}$ and $Y'_{2-}$ and output two output voltages $Y_{2+}$ and $Y_{2-}$, respectively. The load 420 comprises a parallel connection of a primary inductor 421 (with a center-tap connected to a power supply node $V_{DD}$) and a capacitor 424, a secondary inductor 422, and a sensing inductor 423. The primary inductor 421 and the capacitor 424 form a resonant tank to provide a high impedance at $f_{LO}$, so that the two output voltages $Y_{2+}$ and $Y_{2-}$ can be large. The primary inductor 421 and the secondary inductor 422 are magnetically coupled with a first coupling coefficient $k_1$, while the secondary inductor 422 and the sensing inductor 423 are magnetically coupled with a second coupling coefficient $k_2$. The second coupling coefficient $k_2$ is substantially smaller than the first coupling coefficient $k_1$. In an embodiment, by way of example but not limitation, $k_1$ is approximately 0.8, while $k_2$ is approximately 0.15. The primary inductor 421 and the secondary inductor 424 form a transformer that is also known as "balun," which is well known in the prior art and thus not described in detail; the balun can effectively transform the two output voltages $Y_{2+}$ and $Y_{2-}$ into $S_2$, which will be emitted by an antenna 430. The sensing inductor 423 outputs $S_{3+}$ and $S_{3-}$ in accordance with its magnetic coupling with the secondary inductor 422 so that $S_3$ is a replica of $S_2$. Except for the sensing inductor 423, power amplifier 400 is well known in the prior art and thus not further explained. Since the second coupling coefficient $k_2$ is substantially smaller than the first coupling coefficient $k_1$, a loading effect of the sensing inductor 423 is negligible and does not result in an appreciable loss to $S_2$. The magnetic coupling between $S_2$ and $S_3$ is inherently linear due to passivity; therefore, $S_3$ is a replica of $S_3$ except for a loss and a phase shift of the magnetic coupling.

Figure 5:
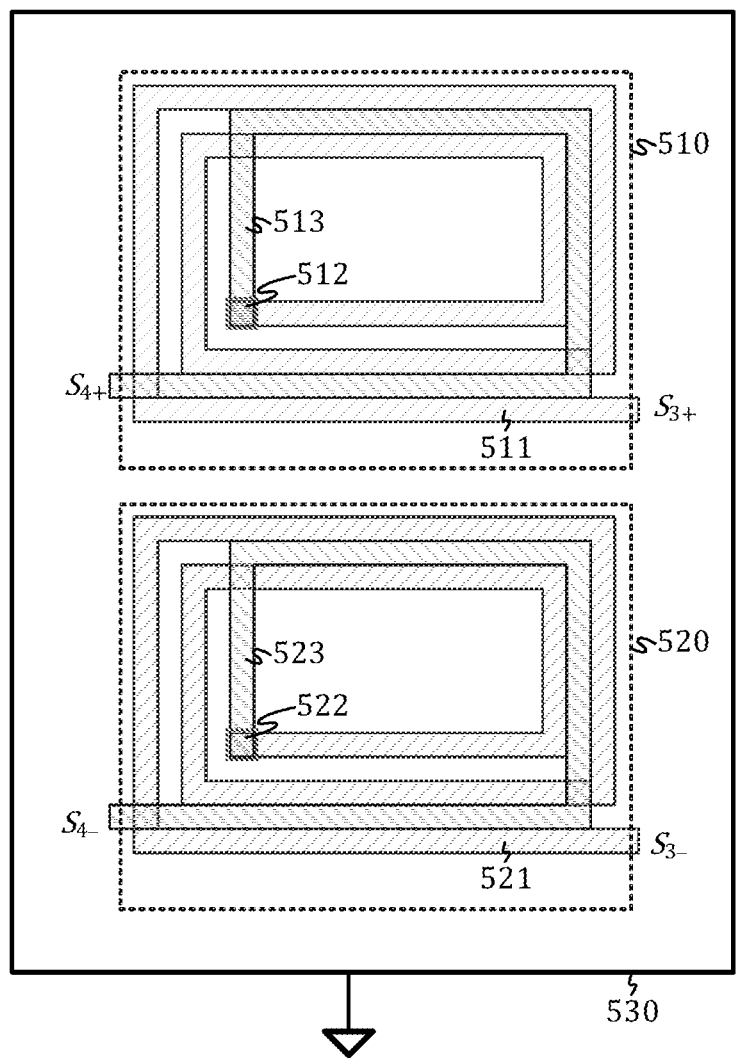
FIG. 5 shows a top view of a layout of a shielded serial inductor that can be used in the self-loopback radio transmitter of FIG. 2.

The shielded serial inductor 240 is used to provide a lowpass filtering function to filter the third RF signal $S_3$ into the fourth RF signal $S_4$, which in a differential-signaling embodiment comprises two voltages $S_{4+}$ and $S_{4-}$. The lowpass filtering can effectively suppress a high-frequency noise in $S_4$. The shielded serial inductor 240 is laid out in a multi-layer structure including an upper metal layer and a plurality of lower metal layers including a first lower metal layer and a second lower metal layer. A top view of the shielded serial inductor 240 in accordance with an embodiment of the present disclosure is shown in FIG. 5. The shielded serial inductor 240 comprises: a shield 530 that is laid out on the upper metal layer and connected to a ground node; a first serial inductor 510 configured to connect $S_{3+}$ to $S_{4+}$ in a spiral topology comprising a first coil 511 laid out on the first lower metal layer, a second coil 513 laid out on the second lower metal layer, and a first via 512 configured to provide an inter-metal-layer connection between the first coil 511 and the second coil 513; and a second serial inductor 520 configured to connect $S_{3-}$ to $S_{4-}$ in a spiral topology comprising a third coil 521 laid out on the first lower metal layer, a fourth coil 523 laid out on the second lower metal layer, and a second via 522 configured to provide an inter-metal-layer connection between the third coil 521 and the fourth coil 523. A serial inductor has a lower impedance for a lower frequency signal and a higher impedance for a higher frequency signal, causing the lower frequency signal to flow through easier than the higher frequency signal and thus fulfilling a lowpass filtering function. Therefore, the first serial inductor 510 and the second serial inductor 520 jointly embody a lowpass filter that filters $S_3$ into $S_4$. However, the first serial inductor 510 and the second inductor 520 might pick up unwanted interference signal from magnetic coupling, therefore, the shield 530 is used to provide a shielding function. The shield 530 is connected to a ground node to have a low impedance and thus can provide an effective shielding function. In an embodiment not shown in FIG. 5 but clear to those of ordinary skill in the art, the shielded serial inductor 240 further comprises a shunt capacitor inserted between $S_{3+}$ and $S_{3-}$. In an embodiment not shown in FIG. 5 but clear to those of ordinary skill in the art, the shielded serial inductor 240 further comprises a shunt capacitor inserted between $S_{4+}$ to $S_{4-}$.

Figure 6:
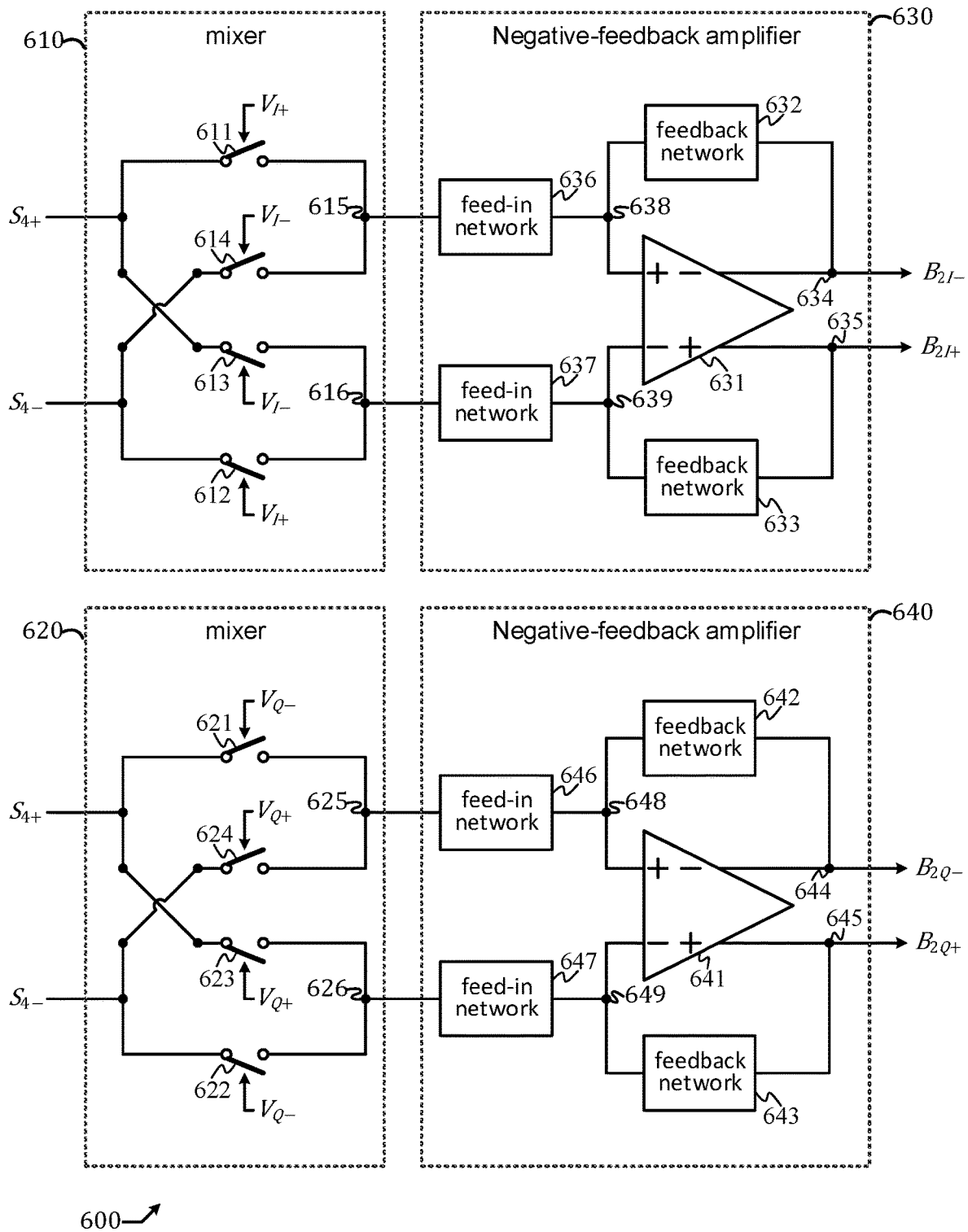
FIG. 6 shows a schematic diagram of a demodulator that can be used in the self-loopback radio transmitter of FIG. 2.

A schematic diagram of a demodulator 600 that can be used to embody the demodulator 250 of FIG. 2 is shown in FIG. 6. Here, in a differential-signaling embodiment, the second baseband signal $B_2$ is two-dimensional signal comprising an in-phase component $B_{2I}$ that comprises two voltages $B_{2I+}$ and $B_{2I-}$ and a quadrature component $B_{2Q}$ that comprises two voltages $B_{2Q+}$ and $B_{2Q-}$. The demodulator 600 comprises a first mixer 610, a second mixer 620, a first negative feedback amplifier 630, and a second negative feedback amplifier 640. In an embodiment, the second LO signal is the same as the first LO signal and comprises four voltages $V_{I+}$, $V_{I-}$, $V_{Q+}$, and $V_{Q-}$ as expressed in equations (9), (10), (11), and (12), respectively. The first (second) mixer 610 (620) comprises four switches 611 (621), 612 (622), 613 (623), and 614 (624). Switch 611 (612, 613, 614, 621, 622, 623, 624) is configured to connect $S_{4+}$ ($S_{4-}$, $S_{4+}$, $S_{4-}$, $S_{4+}$, $S_{4-}$, $S_{4+}$, $S_{4-}$) to node 615 (616, 616, 615, 625, 626, 626, 625) in accordance with $V_{I+}$ ($V_{I+}$, $V_{I-}$, $V_{I-}$, $V_{Q-}$, $V_{Q-}$, $V_{Q+}$, $V_{Q+}$). The first (second) negative feedback amplifier 630 (640) comprises a first (second) operational amplifier 631 (641) configured to receive a differential input signal fed to its two input nodes 638 (648) and 639 (649) via two feed-in networks 636 (646) and 637 (647) and output $B_{2I+}$ ($B_{2Q+}$) and $B_{2I-}$ ($B_{2Q-}$) at its two output nodes 635 (645) and 634 (644), while $B_{2I+}$ ($B_{2Q+}$) and $B_{2I-}$ ($B_{2Q-}$) are fed back to its input nodes 639 (649) and 638 (648) via two feedback networks 633 (643) and 632 (642), respectively. Demodulator 600 is known in the prior art to be able to fulfill the function expressed by equation (7) and thus not described in detail here. In an embodiment, each of feedback networks 632, 633, 642, and 643 comprises a passive element (such as a resistor or a capacitor). In an embodiment, each of feedback networks 632, 633, 642, and 643 comprises a resistor. In an embodiment, each of feedback networks 632, 633, 642, and 643 comprises a parallel connection of a resistor and a capacitor. In an embodiment, each of feed-in networks 636, 637, 646, and 647 comprises a passive element (such as a resistor or a capacitor). In an embodiment, each of feed-in networks 636, 637, 646, and 647 comprises a resistor (which in an extreme case is effectively a short circuit when its resistance is very small). Operation amplifiers are well understood by those of ordinary skill in the art and thus not described in detail here. A negative feedback amplifier can be highly linear if both the feed-in network and the feedback network therein are passive, and the operational amplifier therein has a very high gain.

Self-loopback radio transmitter 200 has a few merits. First, the loopback network 202 can be highly linear. The shielded serial inductor 240 is highly linear thanks to its passive nature, and the demodulator 250 can be highly linear thanks to using negative feedback amplifier. Second, the shielded serial inductor 240 can provide lowpass filtering to resist high frequency noise in the third RF signal $S_3$ and protect itself against detrimental electromagnetic coupling from the environment. Third, the shielded serial inductor 240 itself does not contribute much additive noise thanks to its reactive nature.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A self-loopback radio transmitter comprising:
   a transmitter comprising a modulator configured to up-convert a first baseband signal into a first RF (radio frequency) signal in accordance with a first LO (local oscillator) signal of a LO frequency, and a power amplifier configured to receive the first RF signal and output a second RF signal to be emitted by an antenna and a third RF signal to be looped back, wherein the third RF signal is magnetically coupled from the second RF signal; and
   a loopback network comprising a shielded serial inductor configured to receive the third RF signal and output a fourth RF signal, and a demodulator configured to down-convert the fourth RF signal into a second baseband signal in accordance with a second LO signal of the LO frequency, wherein: the shielded serial inductor is laid out in a multi-layer structure including an upper metal layer and a lower metal layer, and comprises a serial inductor of spiral topology comprising a coil laid out on the lower metal layer shielded by a shield that is laid out on the upper metal layer and connected to a ground node.

2. The self-loopback radio transmitter of claim 1, wherein: the power amplifier comprises a cascode amplifier loaded with a load comprising a resonant tank comprising a parallel connection of a primary inductor and a capacitor, a secondary inductor, and a sensing inductor.

3. The self-loopback radio transmitter of claim 2, wherein the cascode amplifier receives the first RF signal and output an amplified RF signal across the primary inductor, the second RF signal is established across the secondary inductor via a first magnetic coupling between the primary inductor and the secondary inductor, and the third RF signal is established across the sensing inductor via a second magnetic coupling between the secondary inductor and the sensing inductor.

4. The self-loopback radio transmitter of claim 3, wherein the second magnetic coupling is substantially weaker than the first magnetic coupling.

5. The self-loopback radio transmitter of claim 1, wherein the demodulator comprises a mixer and a negative feedback amplifier.

6. The self-loopback radio transmitter of claim 5, wherein the mixer comprises a switch configured to couple the fourth RF signal to an internal node in accordance with the second LO signal, and a negative feedback amplifier configured to receive a signal at the internal node and output the second baseband signal.

7. The self-loopback radio transmitter of claim 6, wherein the negative feedback amplifier comprises an operational amplifier configured to receive an input signal at an input node and output the second baseband signal at an output node, a feed-in network configured to couple the internal node to the input node, and a feedback network configured to provide negative feedback from the output node to the input node.

8. The self-loopback radio transmitter of claim 7, wherein both the feedback network and the feed-in network are passive.

9. The self-loopback radio transmitter of claim 8, wherein the feedback network comprises a resistor.

10. The self-loopback radio transmitter of claim 8, wherein the feedback network comprises a parallel connection of a resistor and a capacitor.

11. The self-loopback radio transmitter of claim 8, wherein the feed-in network comprises a resistor.

12. The self-loopback radio transmitter of claim 1, wherein the shielded serial inductor further comprises a shunt capacitor at a node configured to receive the third RF signal.

13. The self-loopback radio transmitter of claim 1, wherein the shielded serial inductor further comprises a shunt capacitor at a node configured to output the third RF signal.

* * * * *